United States Patent
Noda et al.

[19]

[11] Patent Number: 6,002,166
[45] Date of Patent: Dec. 14, 1999

[54] SEMICONDUCTOR DEVICE

[75] Inventors: Sukehisa Noda; Shinji Yamada; Tooru Iwagami; Seiki Iwagaki; Hisashi Kawafuji, all of Tokyo, Japan

[73] Assignee: Mitsubishi Denki Kabushiki Kaisha, Tokyo, Japan

[21] Appl. No.: 09/117,171

[22] PCT Filed: Nov. 28, 1996

[86] PCT No.: PCT/JP96/03496

§ 371 Date: Jul. 28, 1998

§ 102(e) Date: Jul. 28, 1998

[87] PCT Pub. No.: WO98/24122

PCT Pub. Date: Jun. 4, 1998

[51] Int. Cl.[6] .................................................. H01L 23/495
[52] U.S. Cl. .................... 257/666; 257/723; 257/787; 257/691
[58] Field of Search .................... 257/666, 723, 257/724, 787, 691, 692

[56] References Cited

U.S. PATENT DOCUMENTS

| 5,598,038 | 1/1997 | Sugano . |
| 5,767,567 | 6/1998 | Hu et al. . |
| 5,767,573 | 6/1998 | Noda et al. . |
| 5,872,403 | 2/1999 | Bowman et al. . |

FOREIGN PATENT DOCUMENTS

| 56-122157 | 9/1981 | Japan . | |
| 60-63122 | 4/1985 | Japan . | |
| 63-98631 | 6/1988 | Japan . | |
| 3-32032 | 2/1991 | Japan . | |
| 3-116845 | 5/1991 | Japan . | |
| 3-188661 | 8/1991 | Japan ..................................... | 257/787 |
| 6-45379 | 2/1994 | Japan . | |
| B2 6-80748 | 10/1994 | Japan . | |
| 7-250485 | 9/1995 | Japan . | |

*Primary Examiner*—Sheila V. Clark
*Attorney, Agent, or Firm*—Oblon, Spivak McClelland, Maier & Neustadt, P.C.

[57] ABSTRACT

The present invention relates a semiconductor device, and in particular, it aims at providing a semiconductor device having high reliability by making coating of a region where a gold wire has been used, which has been performed for preventing deformation and breakage of the gold wire in pressure fitting of resin, unnecessary and preventing deformation and breakage of the gold wire without increasing the fabrication cost, in a semiconductor device packaging a power device and a control device controlling this power device. In order to attain the aforementioned object, a mold gate (21) is provided on a molding die (20) employed in fabrication of the semiconductor device to be positioned on a side where a power device (PD) is arranged in a state placing a lead frame (10). While mold resin (MR) is introduced through this mold gate (21), the mold resin (MR) is injected at a fast speed until reaching a region where a gold wire (W2) is arranged and thereafter injected at a speed causing no deformation or breakage of the gold wire (W2) at this time.

8 Claims, 9 Drawing Sheets

F I G . 3
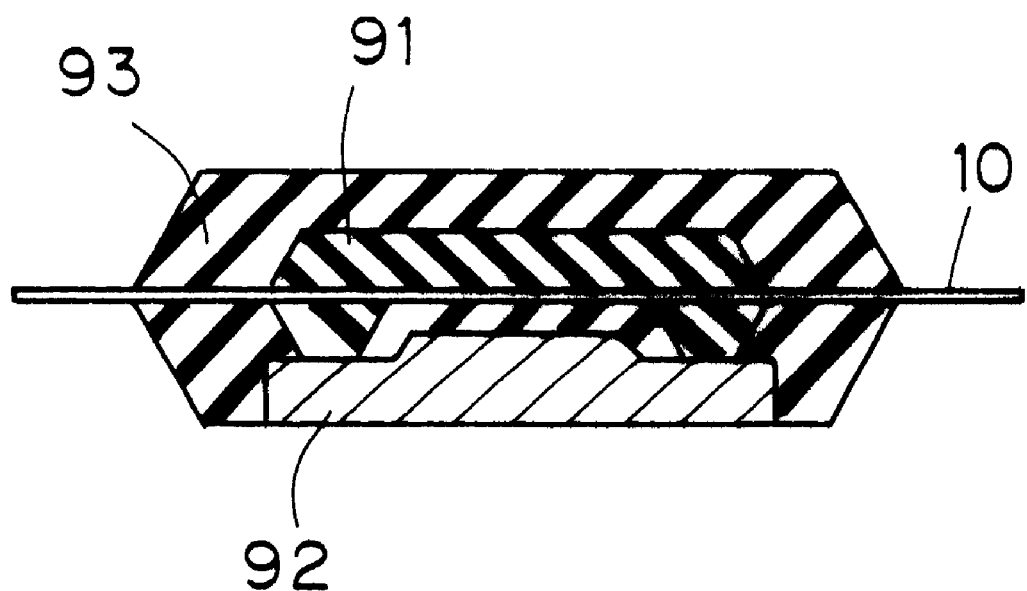

SEMICONDUCTOR DEVICE

TECHNICAL FIELD

The present invention relates to a semiconductor device, and more particularly, it relates to a semiconductor device packaging power devices and a control device controlling these power devices.

BACKGROUND TECHNIQUE

FIG. 8 shows a semiconductor device described in Japanese Patent Laying-Open Gazette No. 7-250485. The semiconductor device shown in FIG. 8 is a perspective view showing a module (Intelligent Power Module: hereinafter abbreviated as IPM) 80 storing power devices and an IC-ed control device controlling these power devices in a single package.

Referring to FIG. 8, the IPM 80 comprises a control IC 2100 which is an IC-ed control circuit and power chips 2200 which are power devices in an upper package OP10. The control IC 2100 and the power chips 2200 are electrically connected with control terminals TM10 and main circuit terminals TM20 respectively in the package. The upper package OP10 and a package base BP10 are formed by molding, and resin, such as epoxy resin, for example, is the main component thereof.

FIG. 9 shows a plan perspective view and a sectional view in case of observing the IPM 80 from the side of the upper package OP10 (upper surface side).

As shown in FIG. 9, the control IC 2100 is electrically connected with the control terminals TM10 through gold wires W20, and the power chips 2200 are electrically connected with the main circuit terminals TM20 through aluminum wires W10.

At this point, the main circuit terminals TM20 have functions for serving not only as terminals but also as die pads for mounting the control IC 2100 and the power chips 2200. A heat sink HP is arranged on lower portions of the control terminals TM10 and the main circuit terminals TM20, to be in a structure of radiating heat generated by the power chips 2200 in a device operation through the heat sink HP.

A fabrication process for the IPM 80 of such a structure is first adapted to prepare a lead frame which is one of elements forming the IPM 80, for die-bonding the control IC 2100 and the power chips 2200 to prescribed positions of this lead frame. The process is then adapted to connect the control IC 2100 and the control terminals TM10 with each other through the gold wires W20 and to connect the power chips 2200 and the main circuit terminals TM20 with each other through the aluminum wires W10, thereby completing packaging on the lead frame. At this point, the diameter of the gold wires W20 is about 30 $\mu$m, and the diameter of the aluminum wires W10 is about 300 $\mu$m.

Then, the IPM 80 is completed by performing transfer molding in a state mounting the aforementioned packaged lead frame on the heat sink HP.

The transfer molding is a method of performing forming of resin by holding the packaged lead frame with upper and lower molds and press-fitting plastified (plastification) thermosetting resin (hereinafter referred to as mold resin) into cavities of these molds. At this point, the gold wires W20 are thinner than the aluminum wires W10 as described above, and hence deformation and breakage of the gold wires such as wire deformation in which the shape of the gold wires W20 is lost by press fitting of mold resin, a wire touch in which adjacent gold wires W20 come into contact with each other and wire disconnection in which the gold wires W20 are broken may take place.

In particular, enlargement of an IPM recently progresses and the volume of a package part is also in a tendency to enlarge. Since advancement of an injection speed is now being required in view of improvement of productivity, prevention of the phenomena described above is an important subject.

A method generally employed in order to prevent the aforementioned phenomena is a method of coating a region where gold wires are employed, i.e., a placed region of a control IC by employing resin such as polyimide, for example, in advance of transfer molding. Namely, a region X to which hatching is applied is the object region, when describing with reference to FIG. 9.

Thus, in the conventional IPM, there has been such problems that it is necessary to coat the region where gold wires are employed in advance of transfer molding in order to prevent deformation and breakage of the gold wires in press fitting of resin, the number of fabrication steps increases, and the fabrication cost increases.

DISCLOSURE OF THE INVENTION

The present invention aims at solving the aforementioned problems, and providing a semiconductor device of high reliability by preventing deformation and breakage of gold wires without increasing the fabrication cost.

A first aspect of the semiconductor device according to the present invention comprises a power device which is arranged on a lead frame, a control device controlling the said power device, and a package sealing the said power device and the said control device with mold resin, wherein the said power device is arranged in a first region on the said lead frame, the said control device is arranged in a second region on the said lead frame, the said first region and the said second region are divided without mixing with each other, the said power device is electrically connected with the said lead frame through a first wire in the said first region, the said control device is electrically connected with the said lead frame through a second wire which is thinner than the said first wire in the said second region, and said package comprises at least one resin inlet port forming on a portion becoming an end surface on the said first region side.

According to the first aspect of the inventive semiconductor device, it comes to that the mold resin injected from at least one resin inlet port first covers the first region. Electrical connection between the power device arranged in the first region and the lead frame is performed through the first wire which is thicker than the second wire, whereby deformation and breakage of the first wire may not be apprehended even if inflow pressure of the mold resin is high, and hence the injection speed for the mold resin can be quickened in an injection initial stage and the productivity can be improved following improvement of the injection speed for the mold resin.

A second aspect of the semiconductor device according to the present invention is such that the said package comprises a first mold resin layer covering the said first region, and a second mold resin layer covering at least the said second region.

According to the second aspect of the inventive semiconductor device, a semiconductor device which can improve the productivity following improvement of the injection speed for the mold resin while preventing deformation and breakage of the second wire can be obtained by performing formation of the first mold resin layer under conditions capable of improving the productivity and performing formation of the second mold resin layer under conditions of preventing deformation and breakage of the second wire.

A third aspect of the semiconductor device according to the present invention is such that the said package is formed by injecting the said mold resin from the said at least one resin inject port at first and second speeds, the said first speed is a relatively fast speed which is maintained from injection start until the said mold resin reaches the said second region, and the said second speed is a relatively slow speed which is supplied after the said mold resin reaches the said second region.

According to the third aspect of the inventive semiconductor device, package is formed by injecting the said mold resin from at least one resin inlet port at the first and second speeds, and at this time, the said first speed is the relatively fast speed which is maintained from injection start until the said mold resin reaches the said second region, while the said second speed supplied after reaching the said second region is rendered a speed slower than the said first speed. Therefore, the productivity can be improved following improvement of the injection speed for the mold resin by injecting the mold resin at the relatively fast first speed from injection start until the said mold resin reaches the second region. Further, it is possible to prevent the second wire which is thinner than the first wire from deforming or breaking by the mold resin by rendering the injection speed the relatively slow second speed after the mold resin reaches the second region. Therefore, it is not necessary to coat the second region in advance of injection of the mold resin for preventing deformation and breakage of the second wire, a step accompanying coating becomes unnecessary, fabrication steps are simplified, and a semiconductor device reducing the fabrication cost can be obtained.

A fourth aspect of the semiconductor device according to the present invention is such that the said at least one resin inlet port is a plurality of resin inlet ports, and the said plurality of resin inlet ports are arranged along the said end surface.

According to the fourth aspect of the inventive semiconductor device, a forward end surface of the mold resin injected from the plurality of resin inlet ports which are arranged along the end surface on the first region side of the package does not partially project, whereby occurrence of difference in a time up to reaching the second region is prevented in a projecting part and a part which is not so, and a prescribed time up to reaching the second region is uniformalized. Therefore, the timing for switching the injection speed for the mold resin from the first speed to the second speed can be correctly decided, and the second wire is prevented from being subjected to deformation and breakage by the mold resin of the first speed at which the injection speed is fast.

A fifth aspect of the semiconductor device according to the present invention is such that respective opening dimensions of the said plurality of resin inlet ports are identical to each other.

According to the fifth aspect of the inventive semiconductor device, a semiconductor device which is suitable to such case that the mold resin is supplied to a plurality of resin inlet ports under the same conditions is obtained.

A sixth aspect of the semiconductor device according to the present invention is such that respective opening dimensions of the said plurality of resin inlet ports are different from each other, and the opening dimensions increase as being directed toward one direction along the said end surface.

According to the sixth aspect of the inventive semiconductor device, the injection amount of the mold resin per unit time can be made identical and the prescribed time up to reaching the second region can be uniformalized by making a resin inlet port existing on a position most approximate to a supply source for the mold resin the one having the minimum opening dimension when the mold resin is not supplied to the plurality of resin inlet ports under the same conditions, e.g., when the distances from the supply source for the mold resin to the plurality of resin inlet ports successively increase.

A seventh aspect of the semiconductor device according to the present invention is such that the said at least one resin inlet port is one resin inlet port extending along the said end surface, and an opening dimension along the said end surface is a length which is shorter than the length of the said end surface.

According to the seventh aspect of the inventive semiconductor device, a forward end surface of the mold resin injected from one resin inlet, whose opening dimension is shorter than the length of the end surface, extending along the end surface on the first region side of the package does not partially project, whereby occurrence of difference in a time up to reaching the second region is prevented in a projecting part and a part which is not so, and the prescribed time up to reaching the second region is uniformalized. Therefore, the timing for switching the injection speed for the mold resin from the first speed to the second speed can be correctly decided, and the second wire is prevented from being subjected to deformation and breakage by the mold resin of the first speed at which the injection speed is fast.

An eighth aspect of the semiconductor device according to the present invention further comprises a heat sink mounting the said package as a first package and radiating heat generated by this first package to the exterior, and a second package sealing the said first package and the said heat sink.

According to the eighth aspect of the inventive semiconductor device, increase of the injection time for the mold resin can be reduced by reducing the volume of the first package to the minimum necessary level. There is no limitation for the injection speed for the mold resin in formation of the second package, whereby the injection time may be short even if the same is of a large volume, and hence the required time for a molding step is reduced as a whole, and increase of the fabrication cost following enlargement of the semiconductor device can be reduced.

BRIEF DESCRIPTION OF THE DRAWINGS

FIG. 3 is a sectional view illustrating the overall structure of the semiconductor device according to the present invention.

BEST MODE FOR CARRYING OUT THE INVENTION

1. Embodiment 1

1-1. Device Structure

Figure 1:
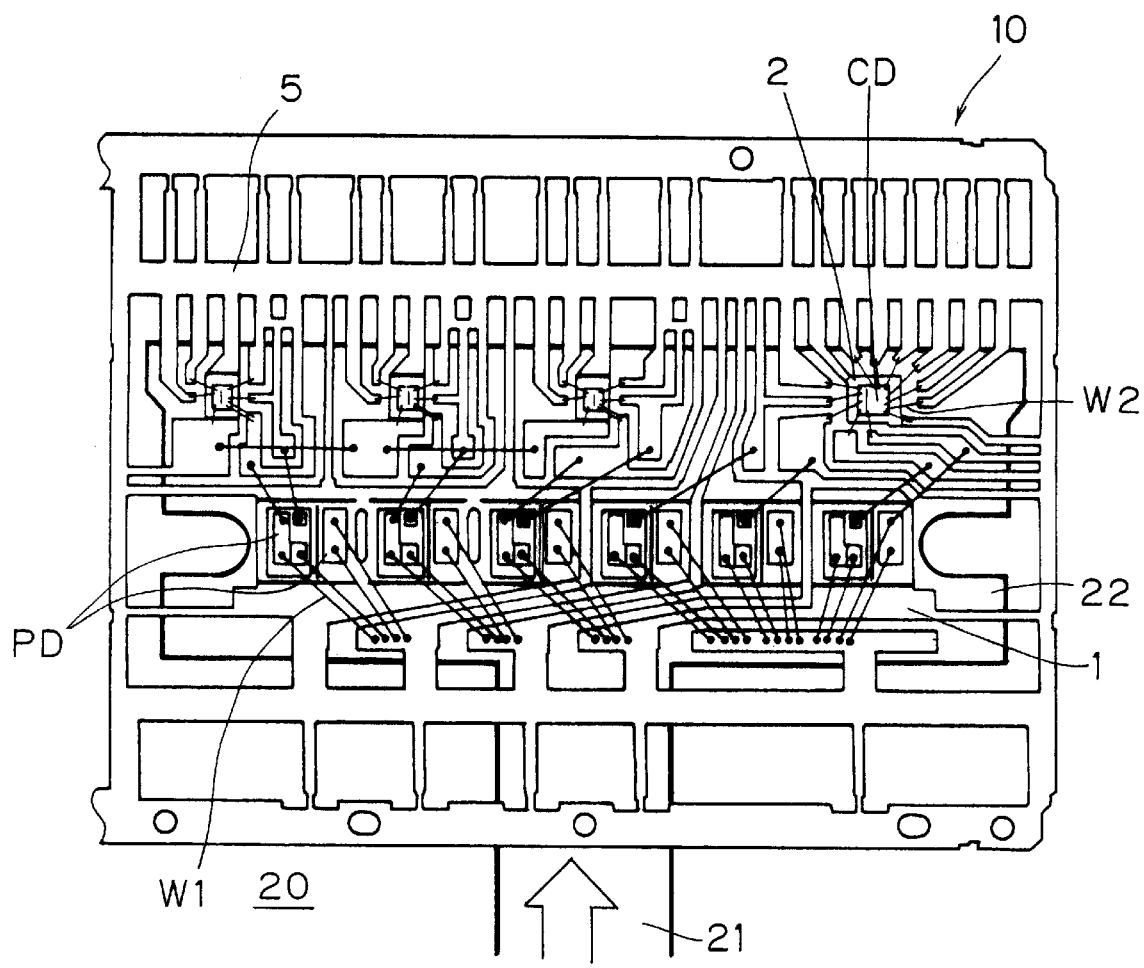
FIG. 1 is a diagram showing a fabrication step of an embodiment 1 of the semiconductor device according to the present invention.

An embodiment 1 of the semiconductor device according to the present invention is described while employing FIG. 1 showing a fabrication step for a module (Intelligent Power Module: hereinafter abbreviated as IPM) 100 storing power devices (power devices) and an IC-ed control unit (control device) in a single package (refer to FIG. 3 shown later).

FIG. 1 is a diagram showing a state of placing a lead frame 10 forming the IPM 100 of FIG. 3 on a substantially rectangular cavity 22 of a molding die 20.

As shown in FIG. 1, the lead frame 10 has power device die pads 1 and control device die pads 2 extending from a tie bar 5 in plural respectively, and power devices PD are mounted on the power device die pads 1 while control devices CD are mounted on the control device die pads 2, and fixed by die bonding.

The power device die pads 1 and the control device die pads 2 are arranged on single sides of the lead frame respectively. Namely, the power device die pads 1 are arranged/formed on a slightly lower side than the plane center, and the control device die pads 2 are arranged/formed on a slightly upper side than the plane center in FIG. 1.

In the lead frame 10, the power devices PD are electrically connected with prescribed portions on the lead frame 10 through aluminum wires W1, the control devices CD are electrically connected with prescribed portions on the lead frame 10 through gold wires W2, and packaging is completed. At this point, the semiconductor device is so structured that a region (first region) where the aluminum wires W1 are arranged and a region (second region) where the gold wires W2 are arranged do not mix with each other.

The lead frame 10 is so position-controlled that the power device die pads 1 and the control device die pads 2 completely go in the cavity 22 and placed on the molding die 20.

The molding die 20 is the so-called lower molding die of a transfer molding equipment for forming resin by holding a packaged lead frame with upper and lower molding dies and press-fitting plastified (plastification) thermosetting resin (hereinafter referred to as mold resin) into cavities of these molding dies, and the cavity 22 is a concave part which is formed in this lower molding die. While an upper molding die opposed to the molding die 20 exists, it is omitted in the figure.

In the IPM 100, the region where the gold wires W2 are arranged may not be coated with resin such as polyimide for a reason described later, and hence such a structure is not shown in FIG. 1.

A single mold gate 21 (resin inlet port) is provided in the molding die 20, to intersect with a substantially central portion of one longer side of the cavity 22. The mold gate 21 is a groove for introducing mold resin into the cavity 22. This mold gate 21 is formed to be positioned on a side where the power device die pads 1 are arranged, i.e., a side where the power devices PD are arranged in a state placing the lead frame 10.

The contour shape of the cavity 22 in plan view is in a shape incapable of placing the lead frame 10 in such a state that the arrangement side of the power devices PD and the arrangement side of the control devices CD are reversed. Therefore, it can be said that the molding die 20 shown in FIG. 1 is in such a structure that the mold gate 21 is provided on the power device side, and it can be said that the IPM 100 formed by the molding die 20 of such a structure is an IPM into which resin is injected from the power device side.

While FIG. 1 shows the structure of forming the mold gate 21 on the molding die 20 which is the lower mold for simplifying the illustration, the same can be provided on an upper molding die which is not illustrated, as a matter of course.

It goes without saying that the contour shape of the cavity 22 in plan view is properly modified, and it is in a structure that no concave part is provided on lower surfaces of the power device die pads 1 so that the mold resin does not infiltrate therein due to relation of heat radiation in reality.

1-2. Characteristic Function/Effect

Figure 2:
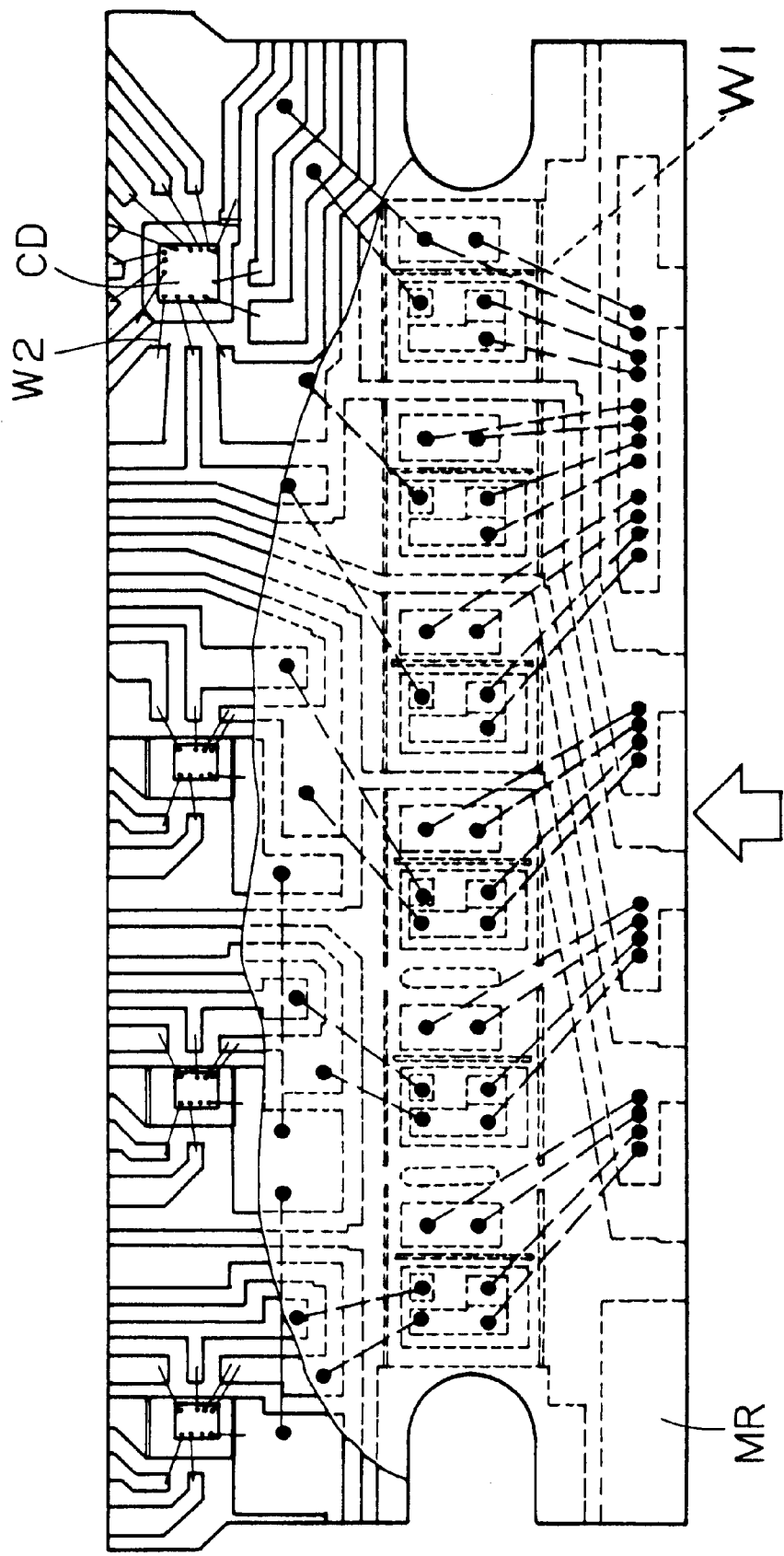
FIG. 2 is a diagram showing an intermediate process of mold resin injection in the embodiment 1 of the semiconductor device according to the present invention.

Next, the characteristic function/effect of this embodiment is described with reference to FIG. 2 showing an intermediate process of mold resin injection into the cavity 22.

Referring to FIG. 2, mold resin MR is in a short shot state, and the mold resin MR introduced from the mold gate 21 of FIG. 1 does not reach the region where the gold wires W2 are arranged. While those of about 30 $\mu$m in diameter are employed for the gold wires W2 at this point, those of about 300 $\mu$m in diameter are employed for the aluminum wires W1, whereby the same have sufficient strength against inflow pressure of the resin.

Therefore, the aluminum wires W1 are not deformed or broken even if the mold resin is injected at a relatively fast speed (first speed) until the mold resin MR reaches the region where the gold wires W2 are arranged, i.e., until a prescribed time (previously known by a test) elapses after injection start, whereby the productivity can be improved following improvement of the injection speed for the mold resin.

After the mold resin MR reaches the region where the gold wires W2 are arranged, deformation and breakage of the gold wires such as wire flowing in which the shape of the gold wires W2 is lost, a wire touch in which adjacent gold wires W2 come into contact with each other and wire disconnection in which the gold wires W2 are broken can be prevented by reducing the injection speed to a relatively slow speed (second speed).

Figure 9:
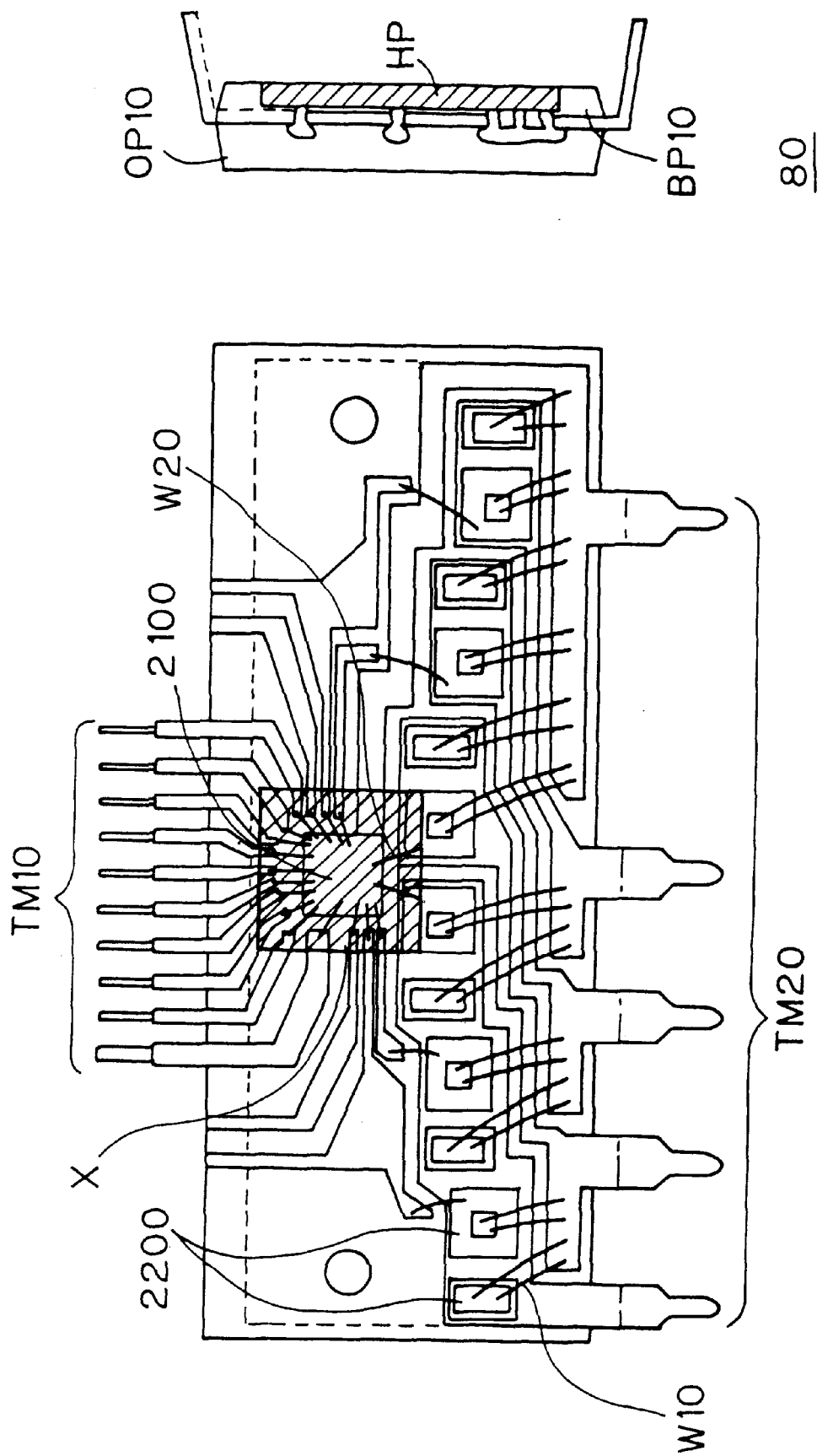
FIG. 9 is a plan view illustrating the structure of the conventional semiconductor device.

Therefore, a semiconductor device having high reliability can be obtained, while the region where the gold wires W2 are arranged may not be coated with resin such as polyimide dissimilarly to the IPM 80 described with reference to FIG. 9, a step accompanying coating becomes unnecessary, fabrications steps are simplified, and the fabrication cost can be reduced.

When the injection speed for the mold resin MR is set at 6 mm/sec. until reaching the region where the gold wires W2 are arranged and at about 0.3 mm/sec. thereafter, the productivity can be improved, while deformation and breakage of the gold wires W2 can be prevented.

1-3. Overall Structure of IPM 100

FIG. 3 shows a sectional view illustrating the overall structure of the IPM 100. FIG. 3 is a sectional view of the substantially rectangular IPM 100 in a shorter side direction. As shown in FIG. 3, the IPM 100 is formed by the first package 91 (including the lead frame 10) 91 formed in the transfer molding step described with reference to FIG. 1, a heat sink 92 mounting this first package 91 and radiating heat generated by the power devices in a device operation to the exterior, and a second package 93 covering the first package 91 and the heat sink 92.

While the mold resin on the lead frame 10 reflecting the shape of the mold gate 21 of FIG. 1 is removed in advance of formation of the second package 93, traces of the mold gate 21 remain on an end surface of one longer side direction of the first package 91, i.e., on an end surface of the side where the power devices PD are arranged, and an injection direction of the mold resin, i.e., the arrangement side of the power devices PD on the IPM 100 can be clearly known.

While the heat sink HP has been in the structure being simultaneously molded with the packaged lead frame in the transfer molding step in the IPM 80 described with reference to FIG. 9, transfer molding of two times is performed for forming the first package 91 by performing transfer molding on the lead frame 10 and thereafter forming the second package 93 by performing transfer molding on the first package 91 and the heat sink 92 in the IPM 100.

In the state of the first package 91, at this point, lower surfaces of the power device die pads 1 are not covered with the mold resin but exposed. The device is in a structure capable of univocally settling the distances from the lower surfaces of the power device die pads 1 to the heat sink 92 by mounting the first package 91 on the heat sink 92.

By bringing the device into such a structure, the distances from the lower surfaces of the power device die pads 1 of FIG. 1 to the heat sink 92 of FIG. 3 can be correctly maintained, and a semiconductor device excellent in insulation property and heat radiation property can be obtained.

While the lead frame 10 is formed by a metal plate having a uniform thickness, the lead frame 10 of such a structure can be used since the same is in a structure excellent in heat radiation property as described above and hence deformation by heat or the like does not take place even if the thickness of the power device die pads 1 is equalized with that of the control device die pads 2.

While a package of a large volume is required following enlargement of the device, it takes time to form a package of a large volume by single transfer molding, and a generation ratio of defectives also increases.

Namely, it is necessary to reduce the injection speed for the mold resin after the mold resin MR reaches the region where the gold wires W2 are arranged in the IPM 100, as described with reference to FIG. 2. It takes a long time to fill up a package of a large volume with mold resin in a state reducing the injection speed. According to the structure shown in FIG. 3, however, increase of the injection time for the mold resin can be reduced by reducing the volume of the first package 91 to the minimum necessary level.

In formation of the second package 93, there is no limitation for the injection speed for the mold resin, whereby the injection time may be short even if the same is of a large volume.

In formation of the second package 93, there is no limitation in particular in the injection direction for the mold resin either, while the injection direction for the mold resin is set in the same direction as that for the first package, in order to perform an efficient operation in consideration of transportation of the first package 91 and the like.

The aforementioned overall structure of the IPM 100 is similar also in an IPM 200 to an IPM 400 described later, and redundant description is omitted.

2. Embodiment 2

2-1. Device Structure

While the structure of introducing the mold resin from the single mold gate 21 provided to intersect with the substantially central portion of one longer side of the cavity 22 of FIG. 1 has been described in the aforementioned embodiment 1 of the semiconductor device according to the present invention, the mold gate is not restricted to a piece.

As an embodiment 2 of the semiconductor device according to the present invention, a semiconductor device formed by introducing mold resin from a plurality of mold gates is now described.

Figure 4:
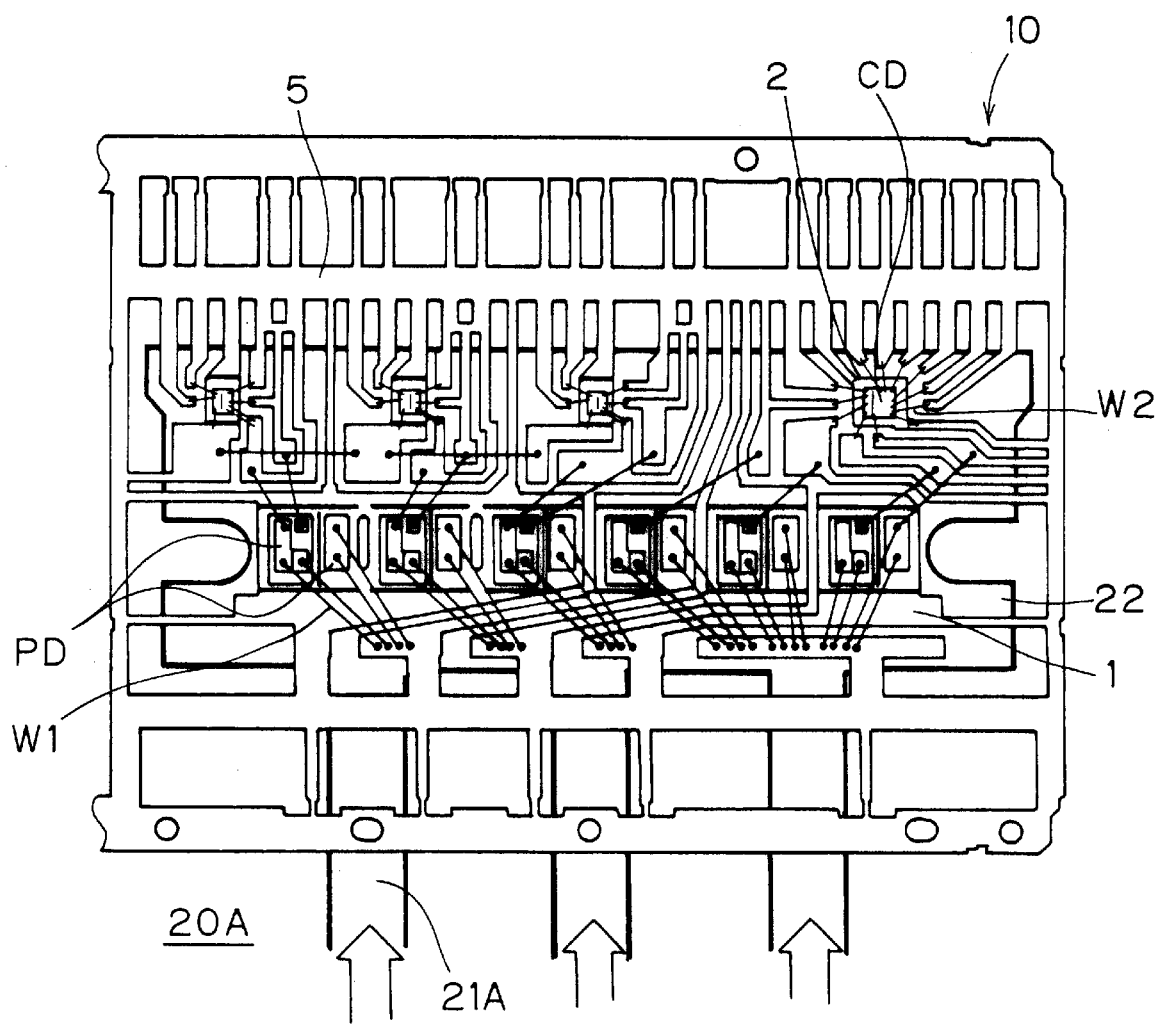
FIG. 4 is a diagram showing a fabrication step of an embodiment 2 of the semiconductor device according to the present invention.

FIG. 4 is a diagram illustrating a fabrication step for an IPM 200 according to the embodiment 2, and is a diagram showing a state of placing a lead frame 10 forming the IPM 200 on a substantially rectangular cavity 22 of a molding die 20A.

Three mold gates 21A of the same groove width are provided substantially at regular intervals on the molding die 20A, to intersect with one longer side of the cavity 22.

These mold gates 21A are formed to be positioned on a side where power device die pads 1 are arranged, i.e., a side where power devices PD are arranged in a state placing the lead frame 10.

While it has been described that the groove widths are identical in the above, it goes without saying that the depths of the grooves are also identical. This also applies to the later description, and depths of grooves are not mentioned, but change of opening areas of mold gates are defined by change of groove widths.

Further, it is assumed that structural portions identical to those of the IPM 100 described with reference to FIG. 1 are described with the same reference numerals, and redundant description is omitted.

2-2. Characteristic Function/Effect

Figure 5:
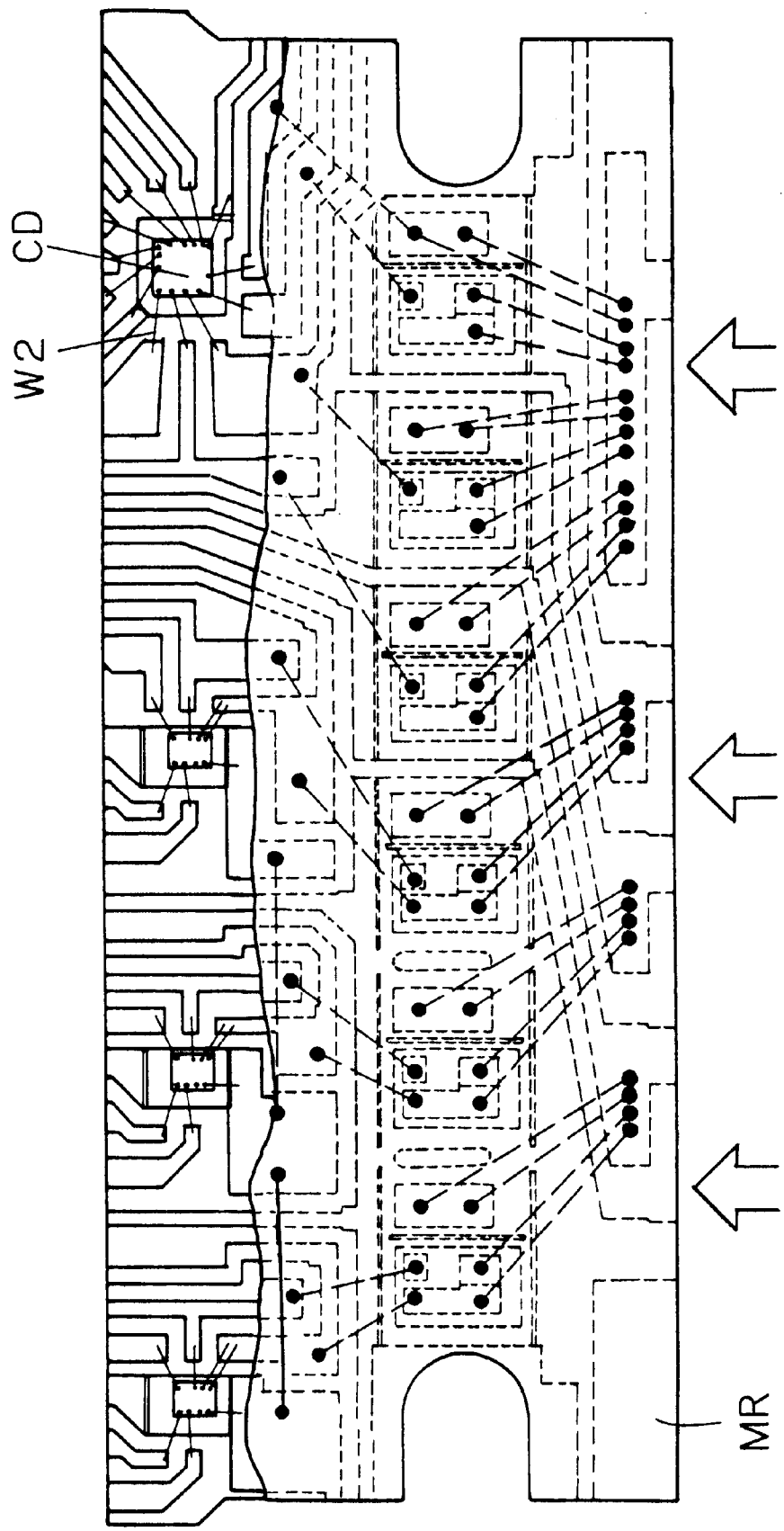
FIG. 5 is a diagram showing an intermediate process of mold resin injection in the embodiment 2 of the semiconductor device according to the present invention.

The characteristic function/effect of this embodiment is now described with reference to FIG. 5 showing an intermediate process of mold resin injection into the cavity 22.

Referring to FIG. 5, mold resin MR is in a short shot state, and the mold resin MR introduced from the three mold gates 21 does not reach a region where gold wires W2 are arranged.

The mold resin MR is substantially homogeneously diffused in the cavity 22 in this state. This is because the mold resin MR is introduced from the three mold gates 21A, injection is well-balanced, and it comes to that the mold resin MR is so diffused that its forward end surface is substantially parallel to the longer side of the cavity 22.

Thus, the mold resin MR is substantially homogeneously diffused in the cavity 22, whereby a prescribed time up to when the mold resin MR reaches the region where the gold wires W2 are arranged can be correctly known, and deformation and breakage of the gold wires W2 can be more reliably prevented.

Namely, the forward end surface of the mold resin MR does not partially project, whereby occurrence of difference in a time up to reaching the region where the gold wires W2 are arranged is prevented in a projecting part and a part which is not so, and the prescribed time up to reaching the region where the gold wires W2 are arranged is uniformalized. Therefore, the timing for switching the injection speed for the mold resin can be correctly decided, and the gold wires W2 are prevented from being subjected to deformation and breakage by the mold resin whose injection speed is fast.

The number of the mold gates 21A is not restricted to three, but properly decided in consideration of the size of the cavity and the like.

2-3. Modification

While the structure of introducing the mold resin from the three mold gates 21A of the same groove width provided substantially at regular intervals to intersect with one longer side of the cavity 22 of FIG. 4 in the aforementioned IPM 200, the groove widths of the mold gates may not be identical.

As a modification of the embodiment 2 of the semiconductor device according to the present invention, a semiconductor device formed by introducing mold resin from a plurality of mold gates whose groove widths are different from each other is now described.

Figure 6:
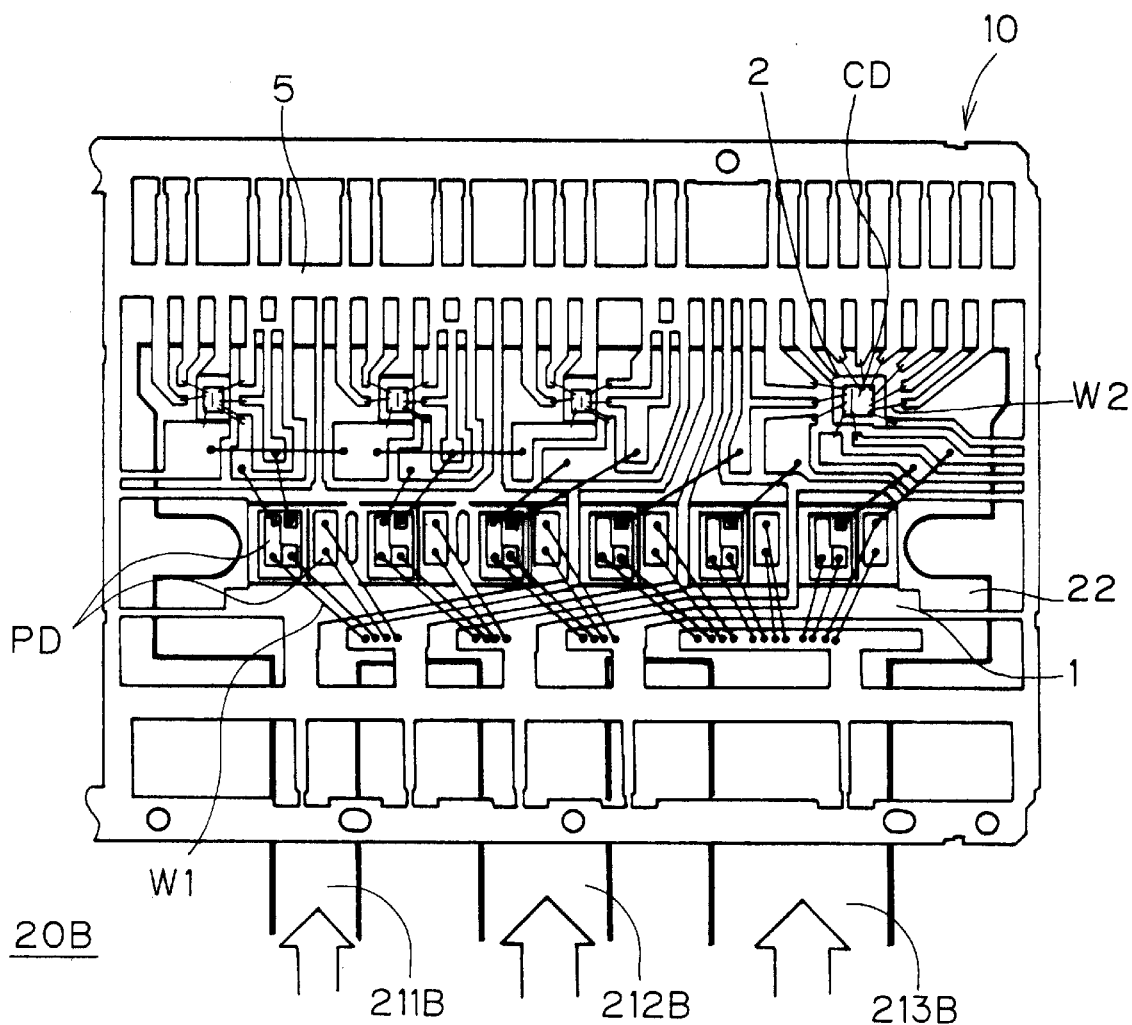
FIG. 6 is a diagram showing a fabrication step of a modification of the embodiment 2 of the semiconductor device according to the present invention.

FIG. 6 is a diagram illustrating a fabrication step for an IPM 300 related to such a modification, and is a diagram showing a state of placing a lead frame 10 forming the IPM 300 on a substantially rectangular cavity 22 of a molding die 20B.

Three mold gates 211B, 212B and 213B whose groove widths are different are provided on the molding die 20B, to intersect with one longer side of the cavity 22. Referring to FIG. 6, the groove widths increase in order of the mold gates 211B, 212B and 213B.

These mold gates 211B, 212B and 213B are formed to be positioned on a side where power device die pads 1 are arranged, i.e., a side where power devices PD are arranged in a state placing the lead frame 10.

In addition, structures identical to those of the IPM 100 described with reference to FIG. 1 are denoted by the same numerals, and redundant description is omitted.

In transfer molding, mold resin is heated/softened in a transfer pot, extruded by a transfer plunger, and injected into a cavity through mold gates. Depending on the positional relation between the transfer pot and the cavity, therefore, there is also such a structure that the distances from the transfer pot to the plurality of mold gates are not identical. While the mold resin is supplied with relatively strong pressure to a mold gate which is on a position close to the transfer pot in this case, pressure of the mold resin supplied to a mold gate on a position far from the transfer pot weakens.

If groove widths are identical in a plurality of mold gates, therefore, injection amounts of the mold resin per unit time vary with the mold gates, and the mold resin cannot be homogeneously diffused in the cavity.

In the molding die 20B shown in FIG. 6, on the other hand, the groove widths of the mold gates 211B, 212B and 213B differ from each other, whereby the injection amounts of the mold resin per unit time can be made identical, and the mold resin can be homogeneously diffused in the cavity.

In the molding die 20B, it goes without saying that the mold gate 211B is on the position most approximate to a transfer pot (not shown).

The groove widths of the mold gates 211B, 212B and 213B are so decided that injection amounts per unit time become identical, in consideration of pressure of the mold resin supplied from the transfer pot.

3. Embodiment 3

3-1. Device Structure

While the structure of homogeneously diffusing the mold resin in the cavity by forming a plurality of mold gates on one longer side of the cavity 22 of FIG. 4 and FIG. 6 has been described in the aforementioned embodiment 2 of the semiconductor device according to the present invention, mold resin can be homogeneously diffused with a single mold gate.

As an embodiment 3 of the semiconductor device according to the present invention, a semiconductor device formed by introducing mold resin from a single mold gate whose groove width is extremely wide as compared with a longer side length of a cavity is now described.

Figure 7:
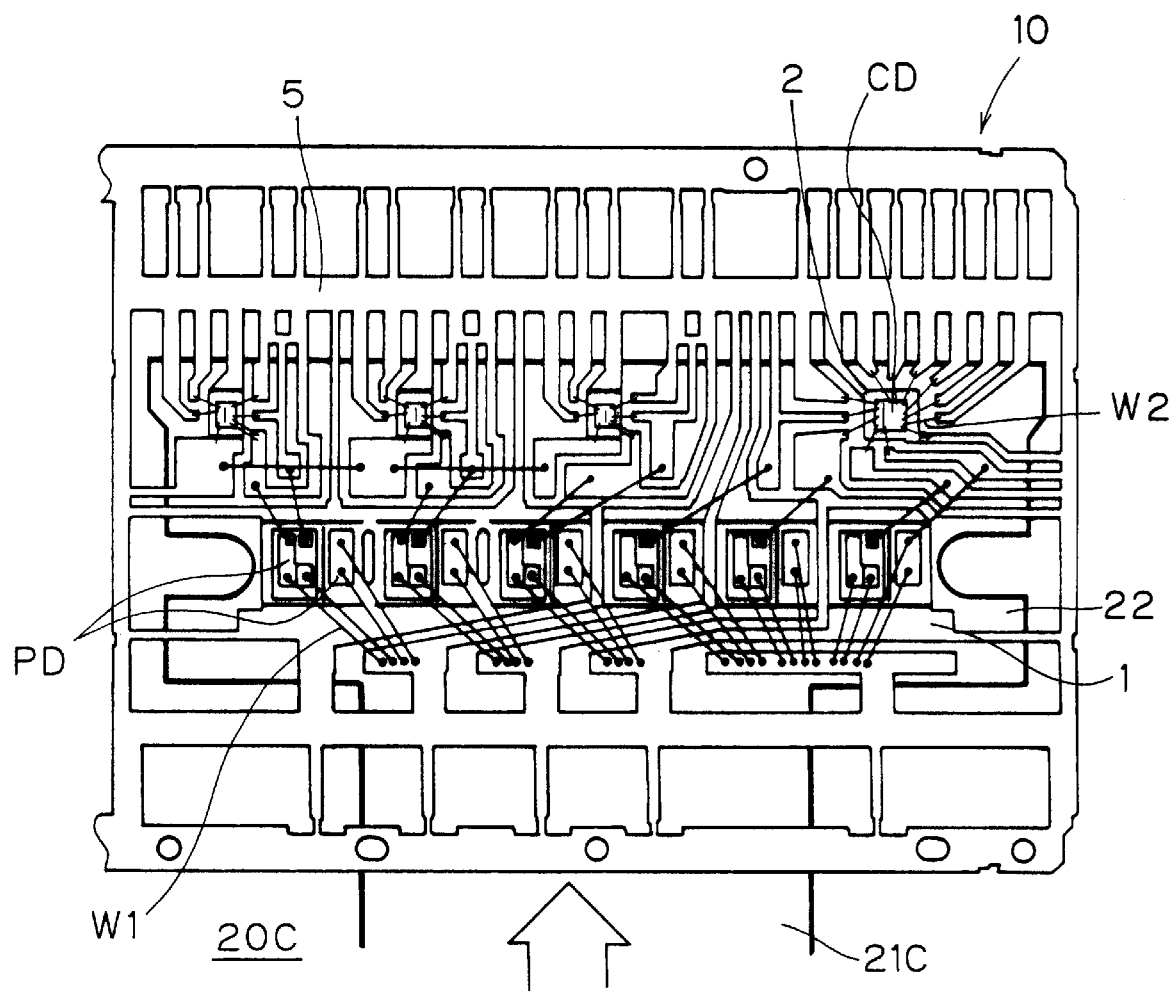
FIG. 7 is a diagram showing a fabrication step of an embodiment 3 of the semiconductor device according to the present invention.
Figure 8:
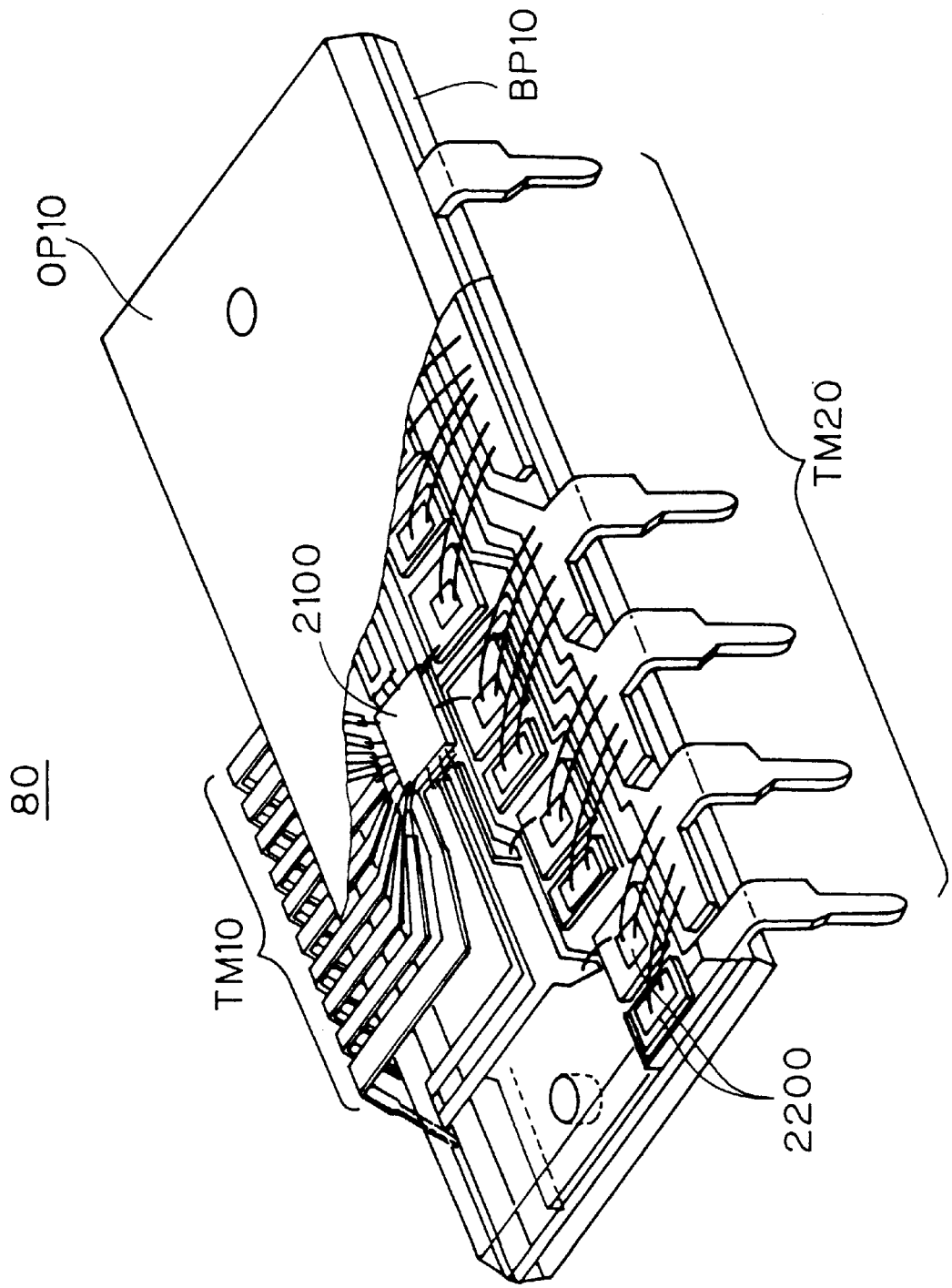
FIG. 8 is a perspective view illustrating the structure of a conventional semiconductor device.

FIG. 7 is a diagram illustrating a fabrication step for an IPM 400 according to the embodiment 3, and is a diagram showing a state of placing a lead frame 10 forming the IPM 400 on a substantially rectangular cavity 22 of a molding die 20C.

The molding die 20C is, to intersect with one longer side of the cavity 22, provided with a single mold gate 21C whose groove width is extremely wide as compared with this longer side.

This mold gate 21C is formed to be positioned on a side where power device die pads 1 are arranged, i.e., a side where power devices PD are arranged in a state placing the lead frame 10.

In addition, it is assumed that structural portions identical to those of the IPM 100 described with reference to FIG. 1 are described with the same reference numerals, and redundant description is omitted.

3-2. Characteristic Function/Effect

It comes to that mold resin MR introduced from the mold gate 21C is substantially homogeneously diffused in the cavity 22. This state is similar to the state described with reference to FIG. 5, and hence illustration is omitted.

Thus, the mold resin MR is substantially homogeneously diffused in the cavity 22, whereby such an effect that a prescribed time up to when the mold resin MR reaches a region where gold wires W2 are arranged can be correctly known and deformation and breakage of the gold wires W2 can be further reliably prevented is similar to that of the IPM 200 described as the embodiment 2.

While the structure of injecting the mold resin MR into the cavity 22 at a relatively fast speed (first speed) and a relatively slow speed (second speed) has been shown in the aforementioned embodiments 1 to 3 of the semiconductor device according to the present invention and described on the assumption that the type of the mold resin MR is identical also in case of changing the injection speed, the type or the composition ratio of the mold resin may be changed following change of the injection speed.

For example, resin whose viscosity is relatively low may be used in case of injecting the same at a relatively fast speed (first speed), and resin whose viscosity is relatively high may be used in case of injecting the same at a relatively slow speed (second speed).

In this way, it comes to that a first mold resin layer is formed with the resin whose viscosity is relatively low on the region (first region) where the aluminum wires W1 and a second mold resin layer is formed with the resin whose viscosity is relatively high on the region (second region) where the gold wires W2 are arranged.

Also in case of using the same mold resin MR, there is such case that two layers are not completely integrated due to difference in solidification time or the like but can be distinguished as first and second mold resin layers as described above in a mold resin layer formed with the mold resin MR injected at a relatively fast speed (first speed) and a mold resin layer formed with the mold resin MR injected at a relatively slow speed (second speed).

We claim:

1. A semiconductor device comprising:

a power device being arranged on a lead frame;

a control device controlling said power device; and a package sealing said power device and said control device with mold resin, wherein said power device is arranged in a first region on said lead frame, said control device is arranged in a second region on said lead frame, said first region and said second region are divided and isolated from each other, said power device is electrically connected with said lead frame through a first wire in said first region, said control device is electrically connected with said lead frame through a second wire being thinner than said first wire in said second region, and said package comprises:

at least one resin inlet port being formed on an end surface of a first region side of said package.

2. The semiconductor device in accordance with claim 1, wherein said package comprises:

a first mold resin layer covering said first region, and a second mold resin layer covering at least said second region.

3. The semiconductor device in accordance with claim 1, wherein said package is formed by injecting said mold resin from said at least one resin inlet port at first and second speeds, said first speed is a relatively fast speed being maintained from injection start until said mold resin reaches said second region, and said second speed is a relatively slow speed being supplied after said mold resin reaches said second region.

4. The semiconductor device in accordance with claim 1, wherein said at least one resin inlet port is a plurality of resin inlet ports, and said plurality of resin inlet ports are arranged along said end surface.

5. The semiconductor device in accordance with claim 4, wherein respective opening dimensions of said plurality of resin inlet ports are identical to each other.

6. The semiconductor device in accordance with claim 4, wherein respective opening dimensions of said plurality of resin inlet ports are different from each other and the opening dimensions increase as being directed toward one direction along said end surface.

7. The semiconductor device in accordance with claim 1, wherein said at least one resin inlet port is one resin inlet port extending along said end surface, and an opening dimension along said end surface is a length being shorter than the length of said end surface.

8. The semiconductor device in accordance with claim 1, further comprising:

a heat sink mounting said package as a first package and radiating heat generated by said first package to the exterior, and a second package sealing said first package and said heat sink.

* * * * *